United States Patent [19]

Hobrecht

[11] Patent Number: 4,642,579

[45] Date of Patent: Feb. 10, 1987

[54] IC LOW-CAPACITANCE, LOW-FREQUENCY, LOW-CURRENT, NON-RADIATING OSCILLATOR

[75] Inventor: Stephen W. Hobrecht, Los Altos, Calif.

[73] Assignee: National Semiconductor Corporation, Santa Clara, Calif.

[21] Appl. No.: 780,789

[22] Filed: Sep. 27, 1985

[51] Int. Cl.[4] ............................................... H03K 3/26
[52] U.S. Cl. ..................................... 331/111; 331/143
[58] Field of Search ........................ 331/111, 143, 173

[56] References Cited

U.S. PATENT DOCUMENTS 4,374,366 2/1983 McGinn ............................... 331/111
4,434,408 2/1984 Baba et al. ........................... 331/111

Primary Examiner—Eugene R. LaRoche
Assistant Examiner—James C. Lee
Attorney, Agent, or Firm—Gail W. Woodward; Paul J. Winters

[57] ABSTRACT

An IC oscillator is disclosed using a small capacitor to determine the fundamental frequency. The capacitor is small enough to permit an on chip capacitor to be used. The capacitor is charged and discharged at the same rate between voltage limits established in the circuit. A single voltage controlled current source controls the charge and discharge currents equally so as to provide a relative low voltage-controlled frequency. The circuit can operate at very low charging currents so that a wide range of control is available. The circuit is configured to produce a very low radiation level.

12 Claims, 2 Drawing Figures

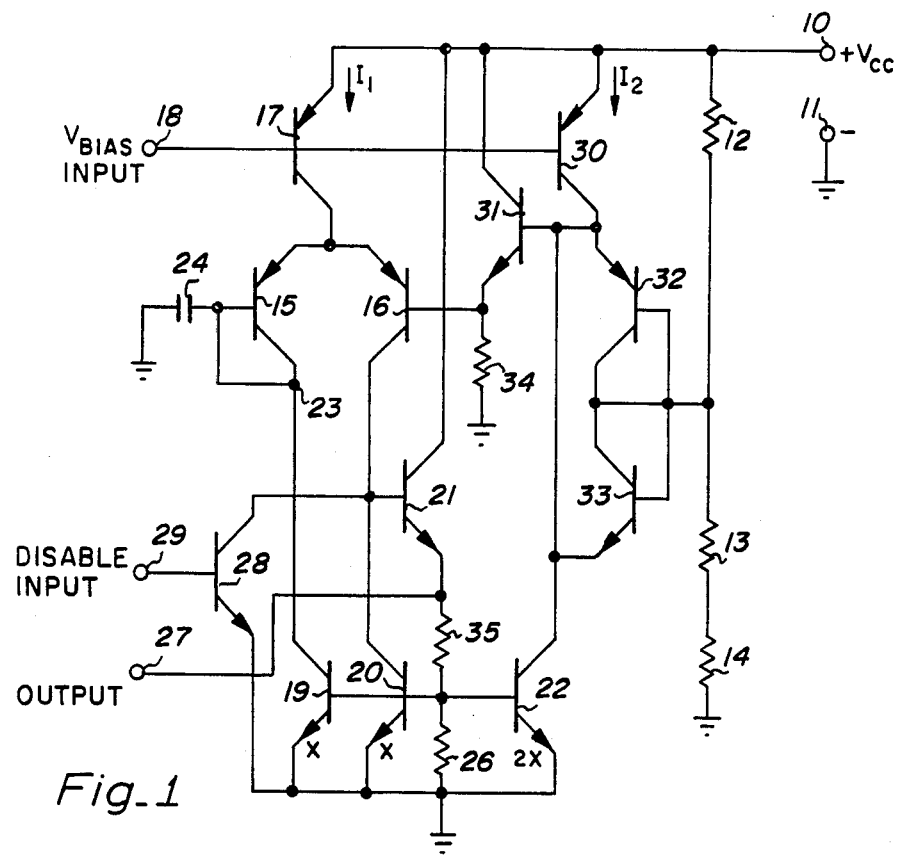
Fig_1
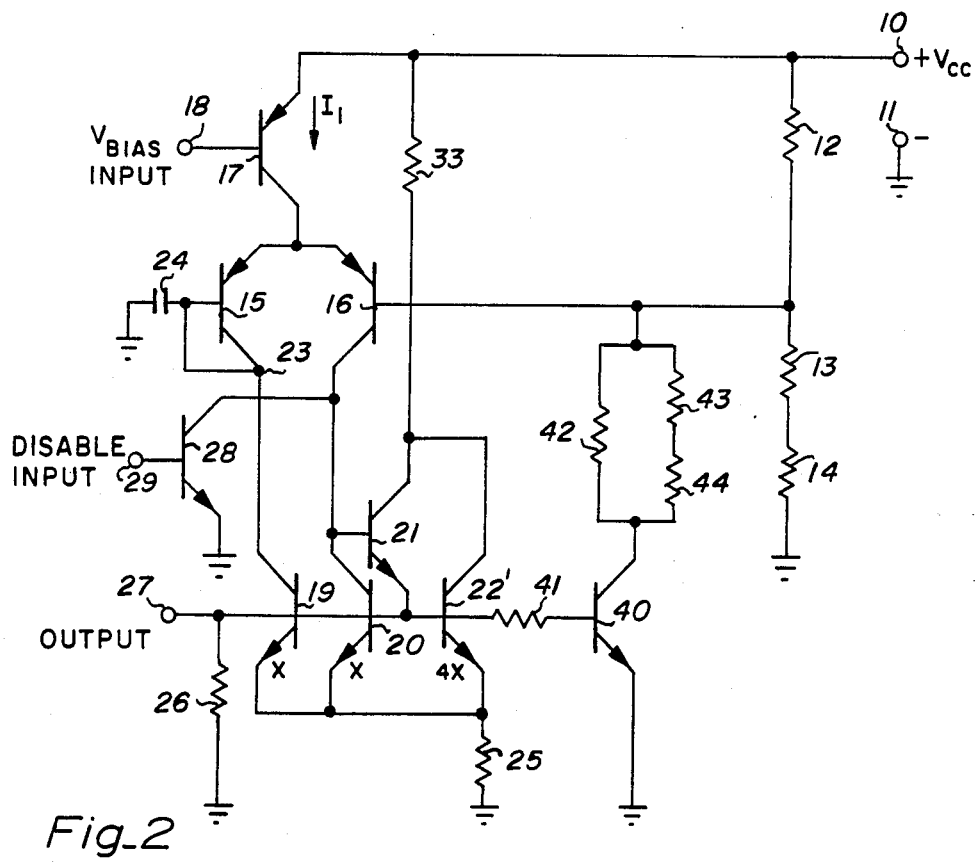
Fig_2

4,642,579

IC LOW-CAPACITANCE, LOW-FREQUENCY, LOW-CURRENT, NON-RADIATING OSCILLATOR

BACKGROUND OF THE INVENTION

Integrated circuit (IC) oscillators are ordinarily of the resistance-capacitance (RC) variety with an active circuit switching to dump the charge on a capacitor so that it can then charge through the resistance. Typically, the capacitor and resistor are external to the IC and the capacitor is relatively large in value. The charge dumping involves transient conditions that favor the radiation of impulse energy that can act as interference to nearby electronic equipment. In order to get low frequency operation the RC components must be quite large so that off chip external parts are commonly required. Since the capacitor is large the charge dump current is large thereby necessitating a rather large discharge transistor. Examples of such circuits can be found in U.S. Pat. Nos. 3,995,232; 4,001,722 and 4,122,413, all of which are assigned to the assignee of the present invention.

SUMMARY OF THE INVENTION

It is an object of the invention to provide an IC oscillator which employs an on chip capacitor and yet operates at low frequencies.

It is a further object of the invention to reduce the charge and discharge currents in an IC oscillator that employs an on chip capacitor.

It is a still further object of the invention to reduce the radiation produced by an IC oscillator.

These and other objects are achieved in the following manner. An IC is constructed with an on chip capacitor having a value in the picofarad to tens of picofarads range. A differential amplifier has its output and inverting input coupled to the capacitor. The differential amplifier has a pair of differentially operated transistors forming the input stage which has a current mirror load. This load includes a pair of matched transistors and a transistor emitter follower that forces one of the load pair to function as a diode. The load further includes a switching transistor driver that couples its output back to the noninverting input of the differential amplifier in a positive feedback arrangement. A resistor voltage divider couples a portion of the supply voltage to the noninverting input to develop its bias. The switching transistor varies the bias in stepwise fashion thereby to determine the oscillator trip points. The capacitor will charge through the differential amplifier at a rate determined by the combined differential transistor emitter current (tail current) until an upper trip point is reached. At this point positive feedback operates to switch the differential so that its current mirror load will discharge the capacitor at the same rate at which it charged. This discharge will continue until a lower trip point is reached whereupon the positive feedback will again switch the differential amplifier and again charge the capacitor. Thus, the capacitor will produce a back to back sawtooth waveform in which the charge and discharge currents are small and equal. As a result, a small capacitor can be made to produce a low frequency oscillation and operate at a low current. The frequency is related inversely with the capacitor size and directly with differential amplifier tail current. Since there is no charge dumping and the operating current is relatively constant, radiation is reduced to a very small value.

BRIEF DESCRIPTION OF THE DRAWING

FIG. 1 is a schematic diagram of the preferred embodiment of the invention.

FIG. 2 is a schematic diagram of a simplified embodiment of the invention.

DESCRIPTION OF THE INVENTION

The schematic diagram of FIG. 1 shows the preferred circuit of the invention. An operating $V_{CC}$ power supply is coupled + to terminal 10 and − to ground terminal 11. Depending on the circuit configuration, the circuit operating frequency may be varied by the supply magnitude, $V_{CC}$. It is for this reason, $V_{CC}$ is ordinarily provided by a voltage regulated supply. Resistors 12–14 form a voltage divider across the $V_{CC}$ supply. If these resistors are of equal value the upper tap on the divider will be at $\frac{2}{3}$ of $V_{CC}$.

The heart of the circuit is formed from an input stage composed of a pair of differentially connected transistors 15 and 16. Transistor 17, supplies a tail current, $I_1$, the value of which is set by the $V_{BIAS}$ potential on terminal 18. A current mirror load is made up of matched transistors 19 and 20. Transistor 21 acting as an emitter follower forces transistor 20 to operate as a diode so that node 23 comprises the differential amplifier input stage single-ended output. Transistor 22, shown having twice the emitter area of either transistor 19 or 20, is also coupled to the mirror so that it will conduct twice the current in transistor 20. The inverting input of the differential amplifier stage is connected to its output for 100% negative feedback and to capacitor 24 which is the main oscillator frequency determining element. Resistor 26 returns the bases of transistor 19, 20 and 22 to ground. Resistor 35 is coupled in series with resistor 26 to form the emitter load of transistor 21. The combined voltage drops across resistors 26 and 35 provides the circuit output of terminal 27.

Transistor 28 has its collector coupled to the collector of transistor 16 and its base is operated from Disable Input terminal 29. During disable, when terminal 29 is high, transistor 28 will turn on and pull the collector transistor 16 low so as to disable the oscillator. This action will turn off the current mirror load transistors 19, 20 and 22. For this condition conduction in resistors 26 and 35 will pull the output down and output terminal 27 will be close to ground.

In the disable state transistor 30, which is matched to transistor 17, conducts $I_2$ which will act to pull the base of transistor 31 which is connected as an emitter follower to drive load resistor 34. This will pull the base of transistor 16 up which will tend to turn it off. This will force $I_1$ into transistor 16 which will thereby charge capacitor 24 until the base of transistor 15 rises above the base of transistor 16 to where transistor 15 is turned off and $I_1$ flows substantially in transistor 16. The upward swing of the base of transistor 16 will be limited, or clamped, by the action of transistor 32. The clamping level will be close to $\frac{2}{3}$ of $V_{CC}$ which is the level at the upper tap on the voltage divider formed by equal value resistors 12–14. It can be seen that the $V_{BE}$ values of transistors 31 and 32 are of opposite polarity and will be substantially equal. As transistor 30 pulls the emitter of transistor 32 up, conduction in transistor 32 will clamp the potential at that point where transistor 32 conducts substantialy all of $I_2$. In this state $I_1$ flows in transistor 28 via transistor 16. Transistor 15 will charge capacitor 24 to its positive peak value where it will remain as long as disable transistor 28 is on. This peak value will be at that level at which the conduction of transistor 15 exactly balances the leakage from node 23 to ground.

When the disable input at terminal 29 goes low transistor 28 will be turned off and the circuit will start oscillating. $I_1$ which formerly flowed in transistor 28 will now flow into the base of transistor 21. The action of transistor 21 will quickly pull the current mirror common node up thereby causing output terminal 27 to be pulled up to its maximum positive value. The current surge in transistor 21 caused by this action is limited by resistor 35 to a safe value. $I_1$ which will now flow in transistor 20 is mirrored in matched transistor 19 which will act to discharge capacitor 24. Thus, node 23 will ramp down at a rate determined by $I_1$.

$I_1$ flowing in transistor 20 will also be mirrored in transistor 22 at $2I_1$. This will pull the base of transistor 16 down to its lowest level which is clamped by transistor 33. When the emitter of transistor 33 is pulled one $V_{BE}$ below its base it will conduct and clamp the voltage at that level. It can be seen that this level will be determined by the potential at the tap of voltage divider resistors 12-14 and will therefore be one $V_{BE}$ below $\frac{2}{3}$ of $V_{CC}$. It can be seen that the $V_{BE}$ values of transistors 31 and 33 are of the same polarity and act to produce a lower clamp level. The base of transistor 16 is close to two $V_{BE}$ drops below $2 V_{CC}/3$. This is a shift of close to 1.2 volts (at 25° C.) below the clamp level when transistor 28 was on.

Capacitor 24 will continue to discharge or ramp down through transistor 19 until transistor 15 turns on and starts to pass a small portion of $I_1$. At this point, the current in transistor 16 will start to diminish and this will diminish the current in transistor 22. The current $I_2$ flowing in transistor 30 will then pull the base of transistor 16 up, by way of transistor 31, and further diminish its current. This produces a positive feed back that will rapidly pull the base of transistor 16 up to its high limit and thereby turn it off so as to stop the discharge of capacitor 24. The circuit has thus switched states and transistor 15 will again charge the capacitor back towards its upper trip point. $I_1$ will now charge capacitor 24 at the same rate that transistor 19 discharged it.

The above sequence of events will repeat thereby producing a back to back sawtooth of voltage at node 23. Capacitor 24 is sequentially charged and discharged at a rate determined by the value of $I_1$ and the size of the capacitor. The frequency of oscillation, fo, will be:

$$fo = \frac{I_1}{C(2\Delta V)}$$

where

C is the value of capacitor 24 and $\Delta V$ is the peak to peak sawtooth voltage at node 23. It can be seen that fo is primarily determined by $I_1$ and the value of capacitor 24. As pointed out above $\Delta V$ is about 1.2 volts. If capacitor 24 is 20 picofarads, fo will be close to 42 kHz for an $I_1$ of 2 microamperes.

It can be seen that the voltage at the bases of transistors 19, 20 and 22 will swing between zero and $V_{BE}$. The added voltage drop across resistor 35 raises the output signal at terminal 27 to slightly above this value. Typically, this output will be close to 0.75 volt at 300° K.

FIG. 2 is a schematic of an alternative embodiment of the invention. The circuit is similar to that of FIG. 1 and where the parts function in the same manner the same designation are used. It will be assumed that resistors 12-14 and 42-44 are all of the same resistance value R. The main difference in this circuit lies in the means for achieving positive feedback for the switching operation and the means for establishing the $\Delta V$ levels.

In this case current mirror transistor 22' is made to have four times the area of load transistors 19 and 20. Transistor 40 is base driven from the common node of the current mirror through isolation resistor 41. Resistor 33 acts to limit the current surge that occurs when transistor 21 is turned on to charge the common node capacitance of the current mirror. Resistor 25, which is coupled in series with the current mirror transistors 19, 20 and 22, boosts the signal output at terminal 27 above $V_{BE}$ by well over a hundred millivolts. The common node signal is sufficient to force transistor 40 into saturation. In this state resistor 41 limits the flow of base current and the collector will be at $V_{SAT}$ above ground. It can be seen that when transistor 40 is off, the base of transistor 16 will be at about $\frac{2}{3}$ of $V_{CC}$ due to the action of resistors 12-14. When transistor 40 is saturated as will be the case when capacitor 24 is being discharged, resistors 42-44 will be connected essentially across resistors 13 and 14 so that the resistance from the base of transistor 16 to ground will be R/2. Therefore, since all of the resistors 12-14 and 42-44 are the same value, the potential at the base of transistor 16 will be close to $V_{CC}/3$. Accordingly, the circuit operates in a manner similar to that of FIG. 1. However, the $\Delta V$ for the oscillator will be modulated by the value of $V_{CC}$. The current in resistor 25 will be $6I_1$, when capacitor 24 is discharging, and zero when the capacitor is charging. As pointed out above, transistor 40 is driven into saturation whereas switching transistor 22 of FIG. 1 is not. Since a finite time is required for the transistor to turn off from a saturated state, the upper frequency limits of the circuit of FIG. 2 are restricted.

EXAMPLE

The circuit of FIG. 2 was breadboarded using standard junction isolated monolithic silicon IC components. The NPN transistors were of high Beta vertical construction and the PNP transistors were of high Beta lateral construction. The following parts were employed.

| COMPONENT | VALUE | UNITS |
| --- | --- | --- |
| Resistors 12-14 and 42-44 | 10k | ohms |
| Capacitor 24 | 20 | picofarads |
| Resistors 25, 26 | 20k | ohms |
| Resistor 33 | 1k | ohms |
| Resistor 41 | 5k | ohms |

Capacitor 24 was a combination of a discrete capacitor, the junction capacitances of transistors 15, 16, 17 and 19, in addition to stray breadboard capacitance.

The circuit was operated from a 3.6 volt regulated supply. When the potential of terminal 18 was set to produce a $I_1$ value of two microamperes the oscillator produced a frequency of about 46 kHz. The oscillator could be varied from 38 kHz to 59 kHz by varying the potential at terminal 18. The output at terminal 27 was about 0.84 volt and was a square wave.

The invention has been described and an operating example detailed. When a person skilled in the art reads the foregoing description, alternatives and equivalents, within the spirit and intent of the invention, will be evident. Accordingly, it is intended that the scope of the invention be limited only by the claims that follow.

I claim:

1. An IC oscillator circuit comprising:
   a differential amplifier having inverting and noninverting inputs and a single ended output created by means of a current mirror load;
   a capacitor;
   means for coupling said differential amplifier output to said inverting input and to said capacitor whereby said capacitor is charged through said differential amplifier and discharged through said current mirror load; and
   switch means having an input coupled to said current mirror and an output coupled to said differential amplifier noninverting input whereby a positive feedback is established for switching said noninverting input between two distinct control levels.

2. The circuit of claim 1 further including means for varying said control levels to vary the frequency of said oscillator.

3. The circuit of claim 1 further including a tail current supply for said differential amplifier whereby said oscillator frequency is determined primarily by the value of said capacitor and the value of said tail current.

4. The circuit of claim 3 further including means for varying said tail current in response to a control voltage whereby said oscillator frequency is voltage controlled.

5. The circuit of claim 1 further including disable means coupled to said current mirror for turning said oscillator off.

6. The circuit of claim 5 wherein said disable means holds said oscillator off and said capacitor is charged to its maximum voltage level.

7. An IC oscillator circuit comprising:
   a capacitor;
   first and second transistor means coupled together to operate differentially;
   third and fourth transistor means coupled together as a current mirror load and to said first and second transistor means respectively to serve as load elements therefor, said third and fourth transistors having their bases commonly connected to provide a circuit output node;
   means for operating said fourth transistor as a diode;
   means for coupling the base of said first transistor to its collector and to said capacitor whereby said capacitor can be charged through said first transistor and discharged through said third transistor; and
   fifth transistor means having an input coupled to said circuit output node and an output coupled to the base of said second transistor whereby an oscillatory feedback is created.

8. The circuit of claim 7 wherein said first and second transistor means are operated from a source of tail current.

9. The circuit of claim 8 wherein said source of tail current is controlled from a source of voltage that operates to control the frequency of said oscillator.

10. The circuit of claim 7 wherein said fifth transistor means operates to control the potential applied to the base of said second transistor at two different discrete levels and said circuit oscillates between the two levels.

11. The circuit of claim 10 including means to vary said two different discrete levels whereby said oscillator frequency is varied.

12. The circuit of claim 7 including sixth transistor means coupled between a source of disable potential and said second transistor means collector whereby said oscillator can be turned off in response to said disable potential.

* * * * *